(12) United States Patent
Seko et al.

(10) Patent No.: US 8,232,120 B2
(45) Date of Patent: Jul. 31, 2012

(54) MANUFACTURING METHOD OF SEMICONDUCTOR LIGHT-EMITTING APPARATUS AND SEMICONDUCTOR LIGHT-EMITTING APPARATUS

(75) Inventors: Toshihiro Seko, Tokyo (JP); Kazuyuki Yoshimizu, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 409 days.

(21) Appl. No.: 12/539,737

(22) Filed: Aug. 12, 2009

(65) Prior Publication Data
US 2010/0044734 A1    Feb. 25, 2010

(30) Foreign Application Priority Data
Aug. 22, 2008    (JP) .................................. 2008-213800

(51) Int. Cl.
*H01L 33/00*    (2010.01)

(52) U.S. Cl. ........ 438/27; 438/29; 257/98; 257/E33.068

(58) Field of Classification Search .................... 257/91, 257/98, 99, E33.062, E33.068; 438/27, 29
See application file for complete search history.

(56) References Cited

U.S. PATENT DOCUMENTS
2009/0045425 A1*  2/2009  Yasuda et al. ................... 257/98

FOREIGN PATENT DOCUMENTS
JP            2006-086208 A        3/2006
* cited by examiner

*Primary Examiner* — Minh-Loan T Tran
(74) *Attorney, Agent, or Firm* — Holtz, Holtz, Goodman & Chick, PC

(57) ABSTRACT

A method includes forming a light-emission operating layer on a growth substrate; forming a reflection insulating layer on the light-emission operating layer; forming opening portions in the insulating layer; forming a contact portion which has a thickness adapted to flatten the opening portions and has been embedded into the opening portions; forming an electrode layer on the insulating layer and the contact portions; forming a first bonding metal layer on the electrode layer; preparing a supporting substrate in which a second bonding metal layer has been formed; and making the first and second bonding metal layers molten and joined.

5 Claims, 13 Drawing Sheets

MANUFACTURING METHOD OF SEMICONDUCTOR LIGHT-EMITTING APPARATUS AND SEMICONDUCTOR LIGHT-EMITTING APPARATUS

BACKGROUND OF THE INVENTION

1. Field of the Invention

The invention relates to a manufacturing method of a semiconductor light-emitting apparatus and the semiconductor light-emitting apparatus and, more particularly, to a manufacturing method of a semiconductor light-emitting apparatus using a bonding technique by a soldering layer and the semiconductor light-emitting apparatus.

2. Description of the Related Art

A semiconductor light-emitting apparatus having a structure in which a light-emission operating layer formed on a growth substrate is soldered or bonded to a supporting substrate through an AuSn (gold tin) solder has been known in the related art. As an example of the semiconductor light-emitting apparatus having a bonded structure as mentioned above, a cross sectional view of the semiconductor light-emitting apparatus prior to bonding is illustrated in FIG. 1. As shown in FIG. 1, an Au (gold) layer 102, a Ti (titanium) layer 103, an Ni (nickel) layer 104, and an AuSn soldering layer 105 are sequentially laminated on the surface of a supporting substrate 101. A light-emission operating layer 107, an AuZn (alloy made of gold and zinc) layer 108, a TaN (tantalum nitride) layer 109, an Al (aluminum) layer 110, a Ta (tantalum) layer 111, and an Au layer 112 are sequentially formed on the surface of a growth substrate 106. The Au layer 112 and the AuSn soldering layer 105 are closely adhered so as to face each other and, thereafter, the AuSn soldering layer 105 is heated and cooled, so that the AuSn soldering layer 105 is melted and solidified. By the melting and solidification, the growth substrate 106 formed with the light-emission operating layer 107 is soldered to the supporting substrate 101 through the AuSn soldering layer 105. After the soldering, the growth substrate 106 is removed by etching. The AuZn layer 108 has a function for reflecting light which is emitted from the light-emission operating layer 107 and increasing an extracting efficiency of light.

In order to allow the light emitted from the light-emission operating layer 107 to be further efficiently reflected, a structure of a semiconductor light-emitting apparatus in which a reflection insulating layer is formed between the light-emission operating layer 107 and the AuZn layer 108 has been proposed in recent years (refer to Patent Document 1: Japanese Patent Application Laid-open Kokai P 2006-86208). A SiO$_2$ film (silicon oxide film) or a metal oxide film is used as a reflection insulating layer from a viewpoint of controlling current distribution of the light-emission operating layer 107 and efficiently reflecting the light emitted from the light-emission operating layer 107.

In the semiconductor light-emitting apparatus having the reflection insulating layer mentioned above, the reflection insulating layer is not formed on the whole surface of the light-emission operating layer but a reflection insulating layer in which an opening portion is selectively provided is formed. This is because an ohmic contact with the light-emission operating layer can be obtained by embedding a conductive substance such as a metal into the opening portion of the reflection insulating layer, and a current flowing toward the light-emission operating layer can be controlled and assured by the ohmic contact.

As a method of forming the opening portion into the reflection insulating layer in order to obtain the ohmic contact mentioned above, there is a method whereby a resist which has been patterned by a photolithography technique is formed on the reflection insulating layer which has temporarily been formed on the whole surface of the light-emission operating layer and the opening portions are formed by etching the reflection insulating layer by using the resist as a mask. After that, a thin film of a desired metal, alloy, or the like is formed on the reflection insulating layer by an evaporation deposition method or the like, and the growth substrate including the light-emission operating layer is bonded to the supporting substrate through the thin film.

SUMMARY OF THE INVENTION

However, if the thin film of the metal, alloy, or the like is formed on the reflection insulating layer by the evaporation deposition method or the like, concave/convex portions due to a step portion of the opening portion of the reflection insulating layer are caused on the surface of the formed thin film. If the growth substrate containing the light-emission operating layer is bonded to the supporting substrate in the state where the concave/convex portions exist on the surface of the thin film as mentioned above, gaps due to the concave/convex portions are caused at a bonding interface of the supporting substrate and the growth substrate. Voids (that is, cavities) due to the gaps are further caused at the bonding interface of the supporting substrate and the growth substrate. As a capillary tube phenomenon is obstructed by the gaps themselves, the voids caused by the gaps are not blown out to an interface edge portion but remain in the semiconductor light-emitting apparatus, that is, remain at corresponding positions in the opening portions of the reflection insulating layer at the interface. It, therefore, results in a problem of deterioration in performance (deterioration in light-emission efficiency) and a reduction in lifetime of the semiconductor light-emitting apparatus. The voids caused by the gaps also result in a problem such as a reduction in bonding strength of the soldering layer.

The invention is made in consideration of the circumstances as mentioned above and it is an object of the invention to provide a manufacturing method of a semiconductor light-emitting apparatus in which the generation of voids are suppressed at a bonding interface of a light-emission operating layer and has excellent characteristics in terms of a light-emission efficiency, lifetime, and bonding strength and to provide the semiconductor light-emitting apparatus.

To solve the foregoing problems, according to the present invention, there is provided a manufacturing method of a semiconductor light-emitting apparatus, which includes a light-emission operating layer forming step of forming a light-emission operating layer on a growth substrate; a reflection insulating layer forming step of forming a reflection insulating layer on said light-emission operating layer; an opening portion forming step of forming a plurality of opening portions into said reflection insulating layer; a contact portion forming step of forming a contact portion which has a thickness adapted to flatten said plurality of opening portions and has been embedded into each of said plurality of opening portions; an electrode layer forming step of forming an electrode layer on said reflection insulating layer and said contact portions; a bonding metal layer forming step of forming a first bonding metal layer on said electrode layer; a supporting substrate preparing step of preparing a supporting substrate in which a second bonding metal layer has been formed on a surface; and a bonding step of melting and joining said first bonding metal layer and said second bonding metal layer.

According to the invention, there is provided a semiconductor light-emitting apparatus, which includes a light-emission operating layer; a reflection insulating layer which is formed on said light-emission operating layer and includes a plurality of opening portions; a contact portion which has a thickness adapted to flatten said plurality of opening portions and has been embedded into each of said plurality of opening portions; an electrode layer formed on said reflection insulating layer and said contact portions; and a bonding layer in which a first bonding metal layer is formed on said electrode layer and said first bonding metal layer and a second bonding metal layer formed on a supporting substrate are molten and which is formed between said electrode layer and said supporting substrate.

According to the manufacturing method of a semiconductor light-emitting apparatus and the semiconductor light-emitting apparatus of the invention, generation of voids at the bonding interface of the light-emission operating layer and the supporting substrate is suppressed, since the contact portion which has the thickness adapted to flatten the plurality of opening portions and has been embedded therein is formed in each of the plurality of opening portions of the reflection insulating layer formed on the light-emission operating layer. Further, according to the present invention, reduction in light-emission efficiency, lifetime, and bonding strength of the semiconductor light-emitting apparatus can be prevented.

DETAILED DESCRIPTION OF THE PREFERRED EMBODIMENT

An embodiment of the present invention will be described in detail hereinbelow with reference to the drawings.

First, a structure of a semiconductor light-emitting apparatus according to an embodiment of the present invention will be described with reference to FIGS. 2 to 4.

Figure 1:
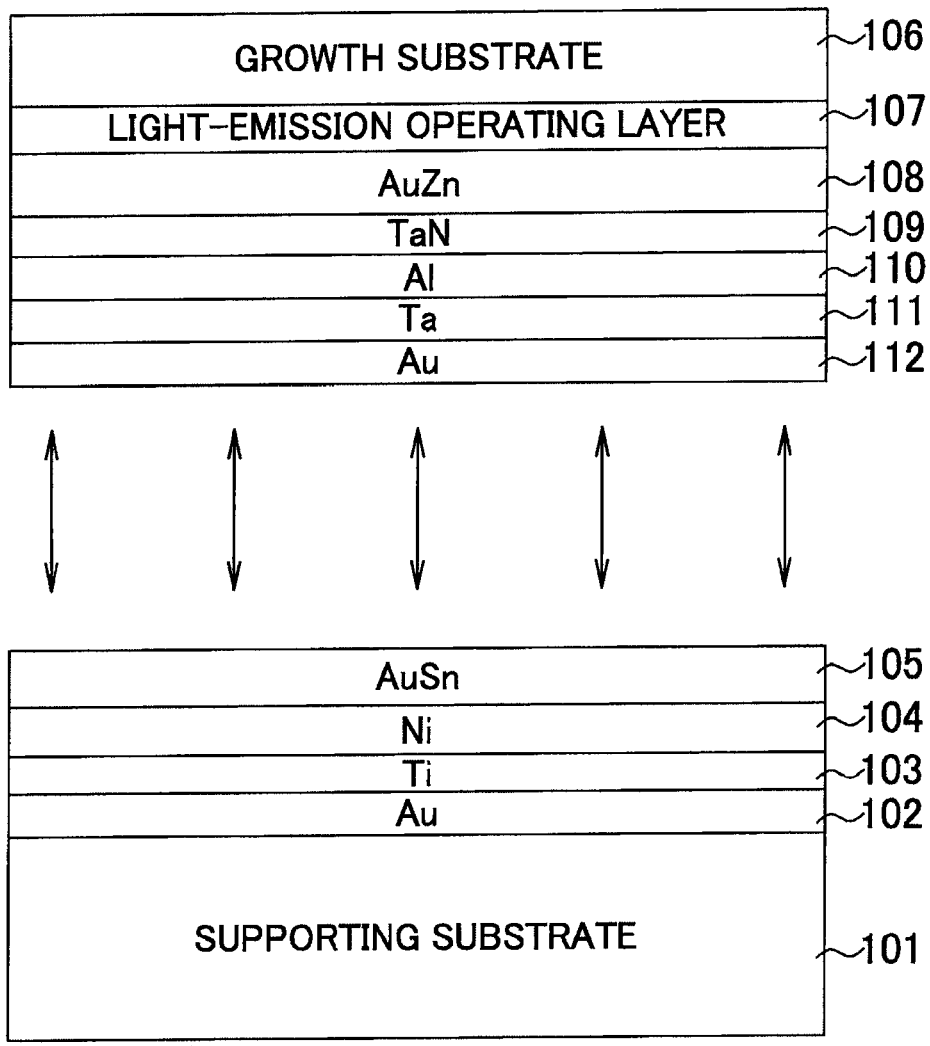
FIG. 1 is a cross sectional view of a semiconductor light-emitting apparatus in the related art before bonding.
Figure 2:
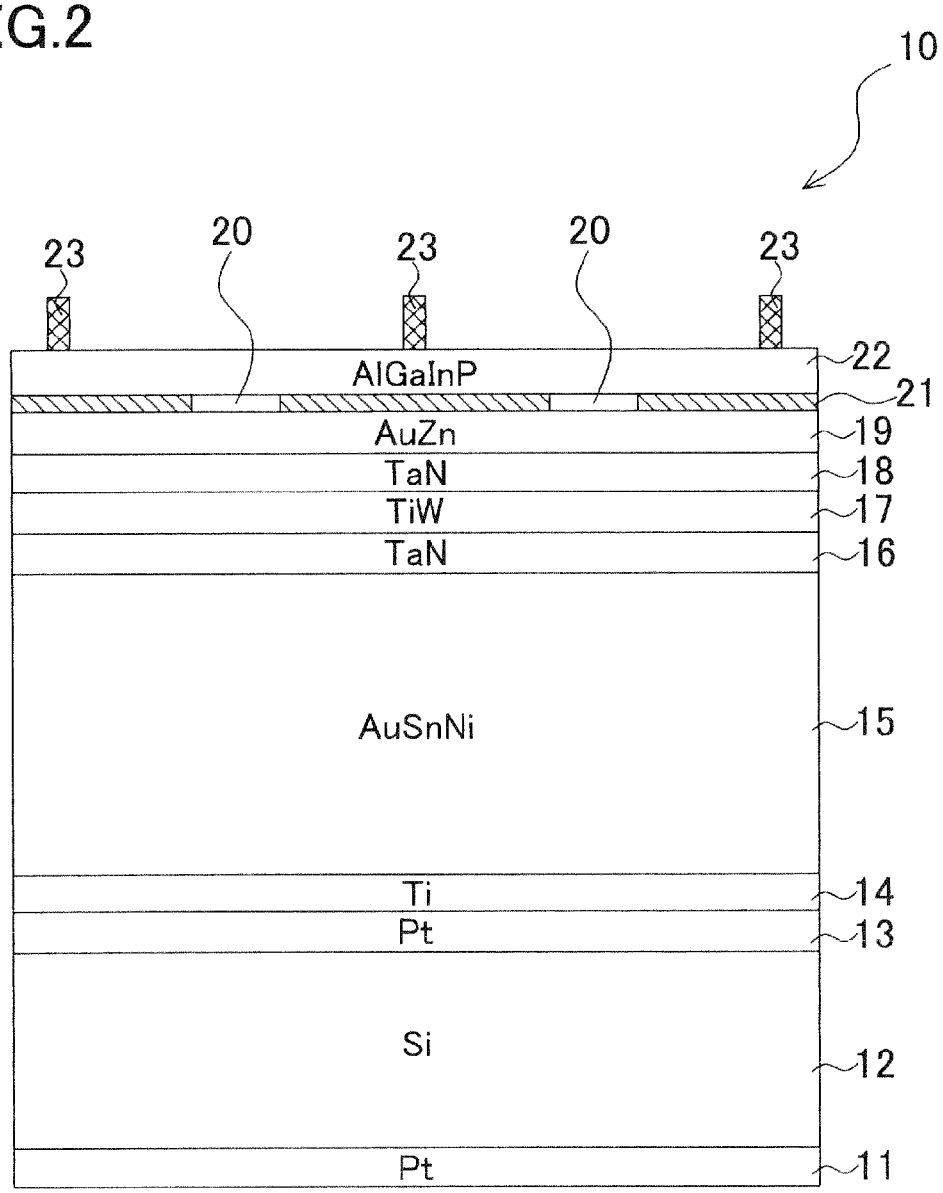
FIG. 2 is a cross sectional view of a semiconductor light-emitting apparatus according to an embodiment of the present invention.
Figure 3:
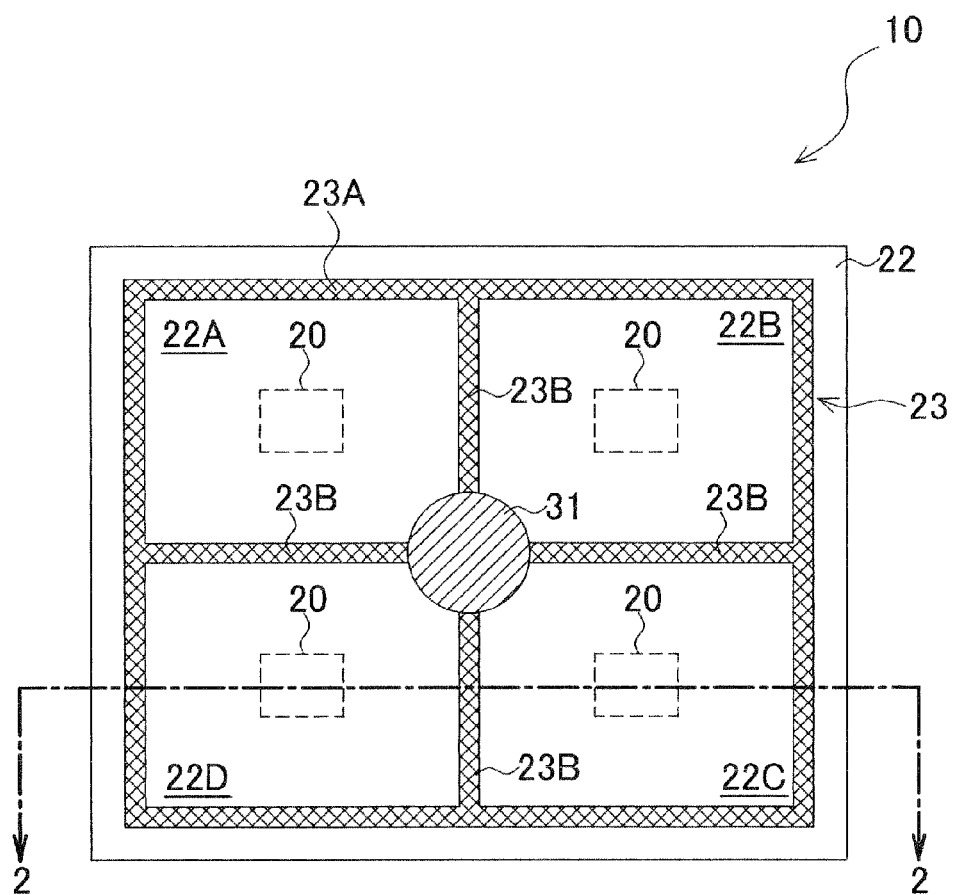
FIG. 3 is a plan view of the semiconductor light-emitting apparatus according to the embodiment of the present invention.

FIG. 2 is a cross sectional view (taken along the line 2-2 (shown by an alternate long and short dash line) in FIG. 3) of a semiconductor light-emitting apparatus 10. As illustrated in FIG. 2, the semiconductor light-emitting apparatus 10 has such a structure that a first Pt (platinum) layer 11, a supporting substrate 12, a second Pt layer 13, a Ti (titanium) layer 14, a bonding layer 15, a first electrode layer 16, a second electrode layer 17, a third electrode layer 18, a fourth electrode layer 19, a reflection insulating layer 21 in which a contact portion (contact layer) 20 has been embedded at a plurality of positions, and a light-emission operating layer 22 are sequentially stacked. A line electrode 23 is formed on the light-emission operating layer 22.

The supporting substrate 12 is a substrate made of, for example, silicon (Si) to which n-type or p-type impurities have been doped. As for concentration of the impurities which are doped, for example, boron is doped at concentration of $3 \times 10^{-18}$ cm$^{-3}$ or more (specific resistance: 0.02 O·cm or less). An electrically conductive material having a high heat conductivity other than silicon, for example, copper (Cu) or the like may be used for the supporting substrate 12. Since the first Pt layer 11 and the second Pt layer 13 are used as ohmic electrodes, it is desirable that their film thicknesses are equal to about 25 nm (nanometers) or more. Since work function of the first Pt layer 11 and the second Pt layer 13 is higher than a work function of the supporting substrate 12, a good ohmic contact between the first Pt layer 11 and the supporting substrate 12 and a good ohmic contact between the second Pt layer 13 and the supporting substrate 12 are obtained. The first Pt layer 11 serves as an electrode for electrically connecting to an outside. The Ti layer 14 is formed as a adhesive layer adapted to increase an adhesion property of a first Sn absorbing layer, which will be described hereinafter. A film thickness of the Ti layer 14 is set to, for example, about 150 nm.

The bonding layer 15 is a layer made of an alloy of AuSnNi formed by thermally pressure-bonding an AuSn soldering layer, first and second Au layers, and first and second Sn absorbing layers made of Ni, which will be described hereinafter.

The first electrode layer 16, second electrode layer 17, and third electrode layer 18 are formed as barrier layers for preventing a diffusion of metal atoms. A film thickness of those three layers is set to, for example, 100 nm. Each of the first electrode layer 16 and the third electrode layer 18 is a layer in which TaN (tantalumnitride) has been deposited. The second electrode layer 17 is a layer in which TiW (titanium-tungsten alloy) has been deposited. A material of each of the first to third electrodes is not limited to the metal as mentioned above but can be properly modified in accordance with a material constructing the bonding layer, a material of the electrode layer directly connected to the light-emission operating layer 22, or the like.

It is desirable to construct the fourth electrode layer 19 in such a manner that light which has entered from the light-emission operating layer 22 can be efficiently reflected at an interface with the reflection insulating layer 21. It is also desirable that the fourth electrode layer 19 is made of a material in which an adhesion property with the contact portion 20 is high. For example, the fourth electrode layer 19 is a layer made of AuZn (alloy made of gold and zinc). A film thickness of the fourth electrode layer 19 is set to, for example, 200 nm.

The reflection insulating layer 21 is formed on the surface of the light-emission operating layer 22 on the side of the bonding layer 15 and has a plurality of opening portions. The contact portions 20 for obtaining the ohmic contact with the light-emission operating layer 22 have been embedded in the opening portions. A film thickness of the contact portion 20 is set to a thickness adapted to flatten the opening portions (concave portions) of the reflection insulating layer 21. It is desirable that the thickness of the contact portion 20 is the same as the film thickness of the reflection insulating layer 21 and is set to, for example, about 100 nm. It is also desirable that an opening area of the opening portion of the reflection insulating layer 21 is reduced and most of the forming surface of the reflection insulating layer 21 on the light-emission operating layer 22 (the surface of the light-emission operating layer 22) is covered with the reflection insulating layer 21. This is because it is necessary that the light generated from the light-emission operating layer 22 is efficiently emitted from the surface side on which the line electrode 23 has been formed, thereby increasing a light-emission efficiency of the semiconductor light-emitting apparatus 10.

Since the contact portion 20 having the thickness as mentioned above has been embedded in each of the plurality of opening portions, the step portions of the opening portions of the reflection insulating layer 21 are eliminated, so that the opening portions are flattened. Since the opening portions of the reflection insulating layer 21 are flattened, the first electrode layer 16, second electrode layer 17, and third electrode layer 18 which are formed on the reflection insulating layer 21 are flatly formed. Further, since a plurality of layers mentioned above are flatly formed, a plurality of metal layers (the AuSn soldering layer, Au layers, and Sn absorbing layers, which will be described hereinafter) serving as a bonding layer 15 by the melting and solidification are also flatly formed. The gaps at the bonding interface at the time of the bonding by the AuSn soldering layer, which will be described hereinafter, are, thus, eliminated and the generation of voids in the bonding layer 15 can be suppressed. Particularly, the remaining of the voids at the corresponding positions in the opening portions of the reflection insulating layer 21 can be suppressed. The reflection insulating layer 21 is, for example, an $SiO_2$ film (silicon oxide film). The contact portion 20 is a layer made of the same material of AuZn as that of the fourth electrode layer 19 from a viewpoint of the adhesion property with the fourth electrode layer 19. The reflection insulating layer 21 may be a layer formed by a metal oxide film. The contact portion 20 may have a multilayer structure in which another metal layer has been stacked on the AuZn layer.

It is not always necessary that the thickness of the contact portion 20 and the film thickness of the reflection insulating layer 21 are completely the same but there may be a difference of about 50 nm or less between them. In the case, for example, when the total area of the contact portions 20 is larger than an area of the reflection insulating layer 21, the film thicknesses of the contact portions 20 may be adjusted so that the total thickness of the contact portions 20 becomes larger than the whole film thickness of the reflection insulating layer 21. When the total area of the contact portions 20 is smaller than the area of the reflection insulating layer 21, the film thicknesses of the contact portions 20 may be adjusted so that the total film thickness of the contact portions 20 becomes smaller than the whole film thickness of the reflection insulating layer 21. If those conditions can be satisfied, the gaps at the bonding interface at the time of bonding by the AuSn soldering layer, which will be described hereinafter, are eliminated and the generation of the voids in the bonding layer 15 can be suppressed.

The light-emission operating layer 22 has such a structure that a plurality of semiconductor layers have been stacked by an epitaxial growth on a substrate for crystal growth (hereinafter, referred to as a growth substrate). For example, the light-emission operating layer 22 is made of an AlGaInP (aluminum gallium indium phosphide) system compound semiconductor and is a layer having a multiple quantum well structure containing a well layer and a barrier layer. The light-emission operating layer 22 may be a layer having a homo pn junction structure, a double-hetero structure, or a single-hetero structure. Further, the light-emission operating layer 22 may have such a structure that it is sandwiched between an n-type clad layer and a p-type clad layer. The light-emission operating layer 22 may be a layer made of an InGaP (indium gallium phosphide) system compound semiconductor. In the embodiment, a description will be made on the assumption that the light-emission operating layer 22 is a layer made of the compound semiconductor of the AlGaInP system.

The line electrode 23 is an electrode formed by using, for example, Au. The line electrode 23 may be an electrode made of Ge (germanium), Sn, Ni, or an alloy of them besides Au.

Subsequently, a positional relation between the line electrode 23 formed on the light-emission operating layer 22 and the contact portions 20 will be described with reference to FIG. 3.

FIG. 3 is a plan view of the semiconductor light-emitting apparatus 10. As illustrated in FIG. 3, a bonding pad 31 is formed at the center on the light-emission operating layer 22. The lattice-shaped line electrode 23 electrically connected to the bonding pad 31 is formed on the light-emission operating layer 22. The line electrode 23 is constructed by: a frame portion 23A formed at a position away from an edge portion of the semiconductor light-emitting apparatus 10 by a predetermined distance; and a connecting portion 23B extending from the center of each side of the frame portion 23A toward the bonding pad 31. With the line electrode 23 having the shape as mentioned above, a surface region of the light-emission operating layer 22 is divided into four rectangular blocks 22A to 22D. An external connecting electrode is constructed by the line electrode 23 and the bonding pad 31.

The contact portion 20 is formed in the reflection insulating layer 21 corresponding to each of the center portions of the four blocks 22A to 22D formed by the line electrode 23. The line electrode 23 and the bonding pad 31 are formed on the light-emission operating layer 22 so as to surround the regions corresponding to the contact portions 20. That is, the contact portions 20 are not opposing to the line electrode 23 and the bonding pad 31. It is desirable that the contact portions 20 are formed at positions which are symmetrical around the bonding pad 31 as a center axis. Owing to the positional relation among the contact portions 20, the line electrode 23, and the bonding pad 31 as mentioned above, the light which is generated from the light-emission operating layer 22 is not obstructed. The light which is generated in the light-emission operating layer 22 can be efficiently emitted to the outside. That is, the light-emission efficiency of the semiconductor light-emitting apparatus 10 is improved by the positional relation as mentioned above.

Figure 4:
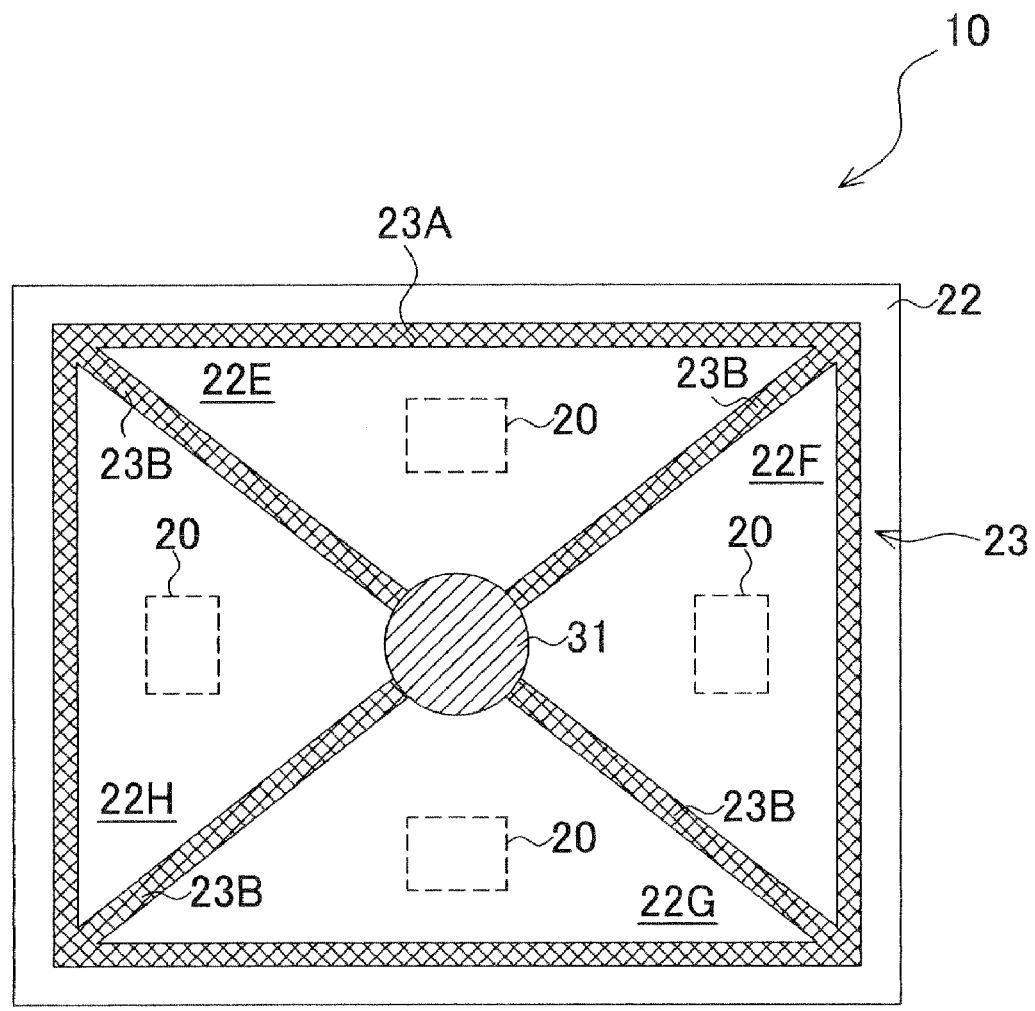
FIG. 4 is a plan view of the semiconductor light-emitting apparatus according to the embodiment of the invention.

The positional relation among the contact portions 20, the line electrode 23, and the bonding pad 31 may be a relation as illustrated in FIG. 4. As shown in FIG. 4, the connecting portions 23B of the line electrode 23 are formed from four vertex portions of the frame portion 23A of the line electrode 23 toward the bonding pad 31. Owing to the shape of the line electrode 23 as mentioned above, the surface region of the light-emission operating layer 22 is divided into four triangular blocks 22E to 22H. The contact portion 20 is formed in the reflection insulating layer 21 corresponding to each of the center portions of the four blocks 22E to 22H formed by the line electrode 23. Owing to the positional relation among the contact portions 20, the line electrode 23, and the bonding pad 31 as mentioned above, since the contact portions 20 are not opposing to the line electrode 23 and the bonding pad 31, the light which is generated in the light-emission operating layer 22 is efficiently emitted to the outside without being obstructed.

A manufacturing method of the semiconductor light-emitting apparatus 10 according to the embodiment will now be described with reference to FIGS. 5A to 11.

Figure 5A:
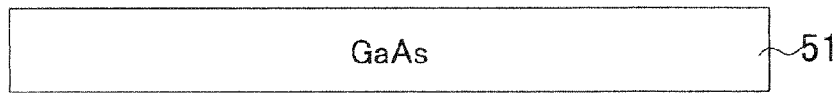
FIGS. 5A to 5F are cross sectional views in manufacturing steps of the semiconductor light-emitting apparatus according to the embodiment of the present invention.
Figure 5B:
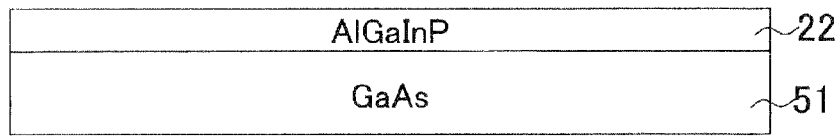

First, a GaAs substrate 51 is prepared as a growth substrate (FIG. 5A). Subsequently, the light-emission operating layer 22 made of the compound semiconductor of AlGaInP system is formed on the prepared GaAs substrate 51 by an MOCVD (Metal Organic Chemical Vapor Deposition) method (FIG. 5B). Growth conditions are set as follows. For example, a growth temperature is set to about 700° C. and a growth pressure is set to about 10 kPa (kilopascal). As material gases, $PH_3$ (phosphine), TMGa (trimethyl gallium), TMA1 (trimethyl aluminum), and TMI (trimethyl indium) are used.

Figure 5C:
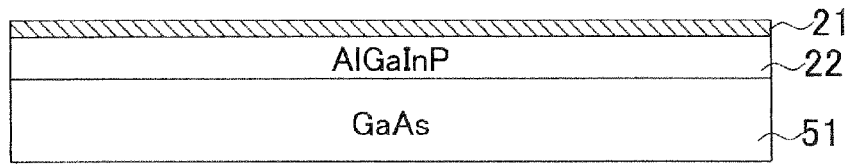
Figure 5D:
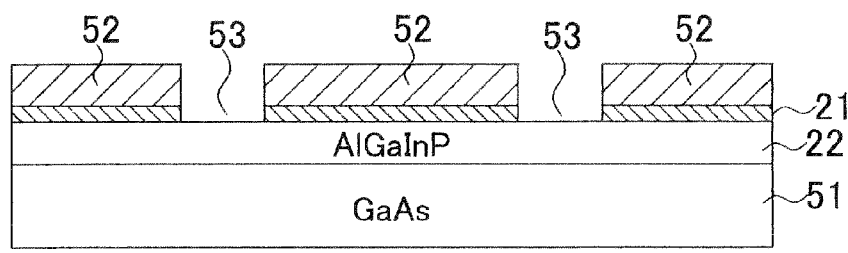

Subsequently, the reflection insulating layer 21 made of $SiO_2$ is formed on the light-emission operating layer 22 by a CVD (Chemical Vapor Deposition) method (FIG. 5C). After that, the surface of the reflection insulating layer 21 is coated with a resist 52. Subsequently, the resist 52 is patterned by a photolithography. Further, etching is executed by using the patterned resist as a mask, so that a plurality of opening portions 53 are formed in the reflection insulating layer 21 (FIG. 5D). The light-emission operating layer 22 is partially exposed by the opening portions 53. In order to prevent such overetching that causes the gaps at the interface of the resist 52 and the reflection insulating layer 21, it is necessary that an etching time is precisely controlled.

Figure 5E:
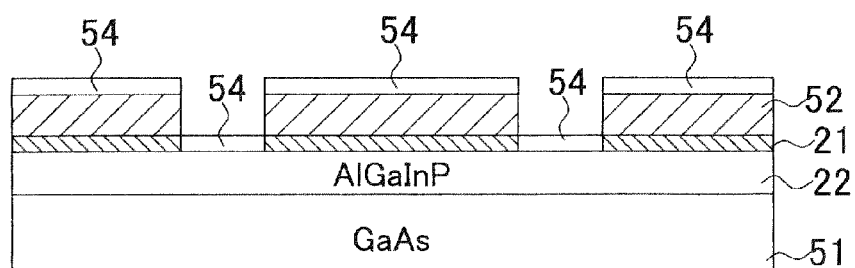

Subsequently, in a state where the resist 52 remains on the reflection insulating layer 21, an AuZn layer 54 is deposited on the exposed light-emission operating layer 22 and resist 52 by sputtering (FIG. 5E). The AuZn layer 54 has a thickness adapted to flatten the opening portions 53 and a part (contact portions 20) of the AuZn layer 54 is embedded into the opening portions 53. It is desirable that a film thickness of the AuZn layer 54 is the same as the film thickness of the reflection insulating layer 21. By the adjustment of the film thicknesses as mentioned above, the step portions between the reflection insulating layer 21 and the opening portions 53 are eliminated and the opening portions 53 are flattened. The AuZn layer 54 may be deposited by a resistance heat evaporation deposition or an electron beam evaporation deposition. In this process step, the opening portions 53 formed by the etching can be accurately embedded, since the AuZn layer 54 is deposited in a state where the resist 52 which is used as a mask of the etching of the reflection insulating layer 21 is left. There is also an advantage that it is unnecessary to execute again the mask forming step using the photolithography.

Figure 5F:
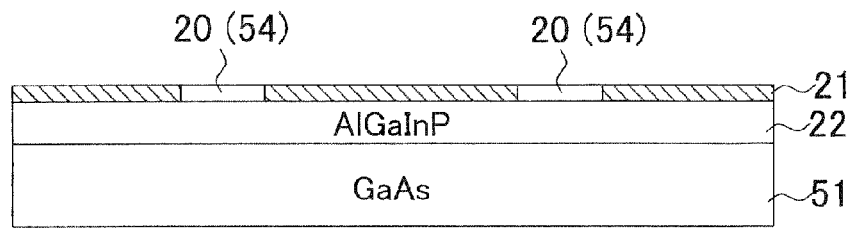

Subsequently, the resist 52 remaining on the reflection insulating layer 21 and the AuZn layer 54 on the resist 52 are removed (FIG. 5F). The formation of the contact portions 20 (AuZn layer 54) which embeds the opening portions 53 is, thus, completed. The opening portions 53 are embedded by the contact portions 20 made of AuZn. Accordingly, the surface of the reflection insulating layer 21 is flat and a plurality of layers (specifically speaking, the first electrode layer 16, the second electrode layer 17, the third electrode layer 18, and a first Sn absorbing layer, which will be described hereinafter, and a first Au layer, which will be described hereinafter) which are formed after that are also flatly formed. The gaps at the bonding interface at the time of bonding by the AuSn soldering layer, which will be described hereinafter, are thus eliminated and the generation of the voids in the bonding layer 15 can be suppressed.

It is not always necessary that the film thickness of the contact portion 20 and the film thickness of the reflection insulating layer 21 are completely the same but there may be a difference of about 50 nm or less between them. In the case, the film thicknesses of the contact portions 20 may be adjusted so that the total film thickness of the contact portions 20 becomes larger than the whole film thickness of the reflection insulating layer 21. When the total area of the contact portions 20 is smaller than the area of the reflection insulating layer 21, the film thicknesses of the contact portions 20 may be adjusted so that the total film thickness of the contact portions 20 becomes smaller than the whole film thickness of the reflection insulating layer 21.

Figure 6A:
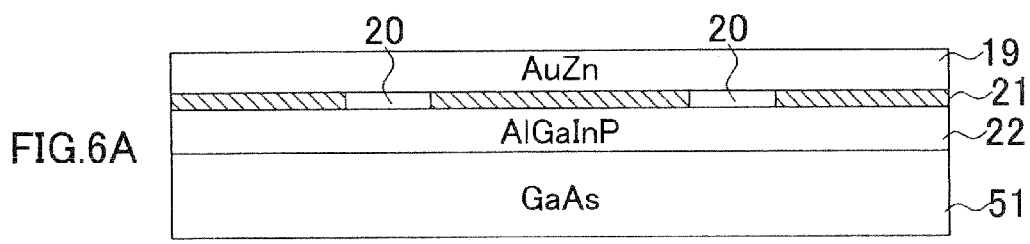
FIGS. 6A to 6D are cross sectional views in the manufacturing steps of the semiconductor light-emitting apparatus according to the embodiment of the present invention.
Figure 6B:
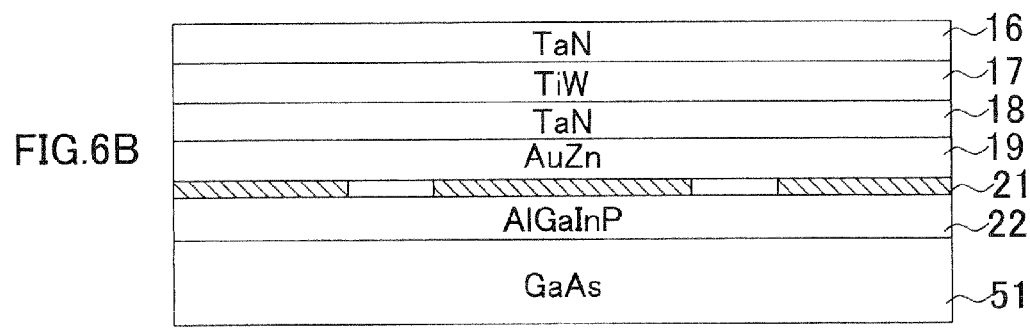

Subsequently, the fourth electrode layer 19 made of AuZn is formed on the contact portions 20 and the reflection insulating layer 21 by sputtering (FIG. 6A). The fourth electrode layer 19 may be formed by the resistance heat evaporation deposition or the electron beam evaporation deposition. Then, the third electrode layer 18 made of TaN is formed on the fourth electrode layer 19 made of AuZn by a reactive sputtering. After that, a heat treatment (annealing) is performed to the GaAs substrate 51 formed with the third electrode layer 18 at about 500° C. under a nitrogen atmosphere. By the heat treatment, an alloy of the light-emission operating layer 22 and the contact portions 20 is formed and the good ohmic contact is obtained. Subsequently, the second electrode layer 17 made of TiW and the first electrode layer 16 made of TaN are sequentially formed on the third electrode layer 18 by the reactive sputtering (FIG. 6B).

Figure 6C:
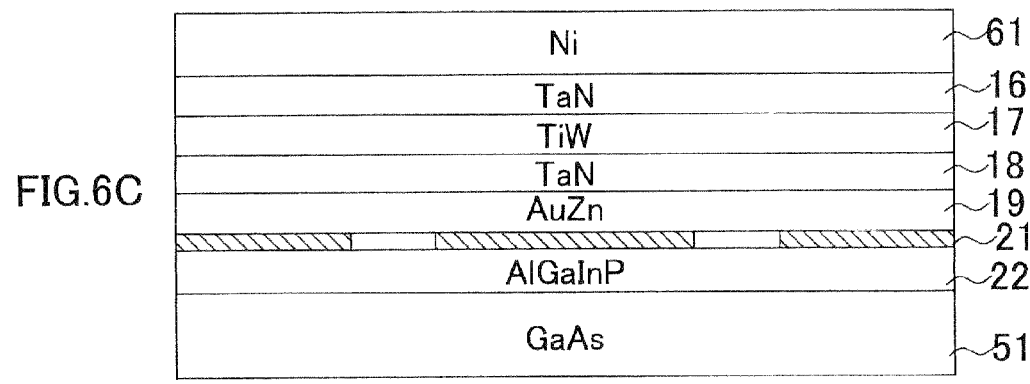

Subsequently, a first Sn absorbing layer (solder absorbing layer) 61 made of Ni is formed on the first electrode layer 16 by the sputtering (FIG. 6C). The first Sn absorbing layer 61 may be formed by the electron beam evaporation deposition. It is desirable that the first Sn absorbing layer 61 has high solderability or solder wettability to the AuSn soldering layer from a viewpoint of suppressing a ball-up when performing melting of the AuSn soldering layer, which will be described hereinafter. Although the first Sn absorbing layer 61 is a layer made of Ni in the embodiment from the viewpoint as mentioned above, it may be a layer made of Pt or Pd (palladium) besides the Ni layer. It is desirable that a film thickness of the first Sn absorbing layer 61 made of Ni is equal to about 150 nm or more from a viewpoint of preventing the voids from remaining at the bonding interface.

Figure 6D:
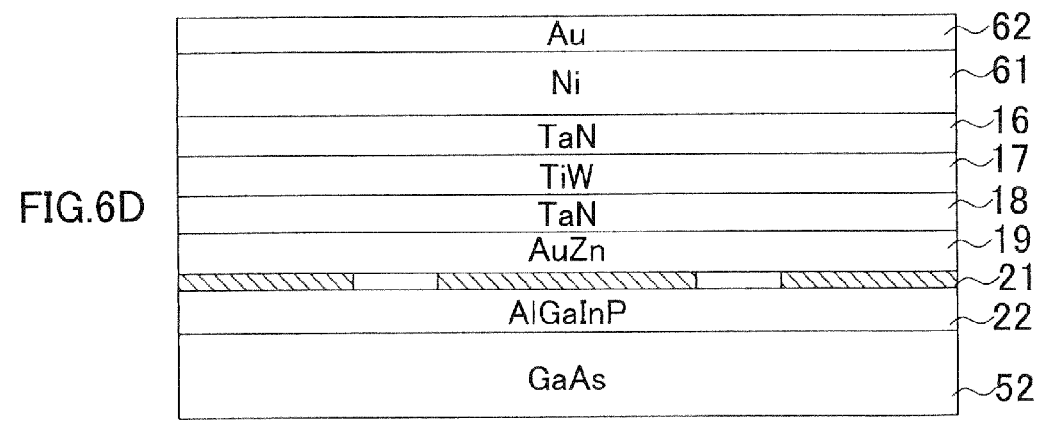

Subsequently, a first Au layer 62 serving as a solder-wettability improving layer is formed on the first Sn absorbing layer 61 by the sputtering (FIG. 6D). The first Au layer 62 is formed to improve the solder wettability to the AuSn soldering layer, which will be described hereinafter. In the embodiment in which the first Sn absorbing layer 61 is the layer made of Ni, the first Au layer 62 prevents oxidation of the Ni layer (that is, the first Sn absorbing layer 61). A film thickness of the first Au layer 62 is equal to, for example, about 30 nm. By finishing the above steps, the formation of a semiconductor light-emission structural body 60 is completed. The first Sn absorbing layer 61 and the first Au layer 62 are collectively referred to as a first bonding metal layer.

Figure 7A:
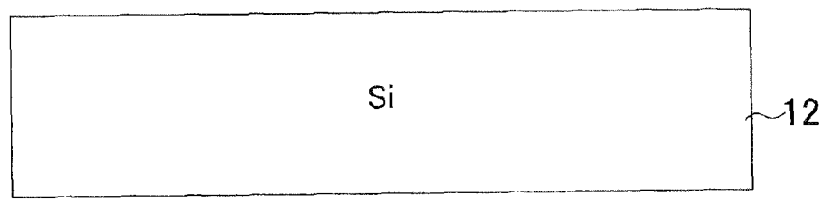
FIGS. 7A to 7D are cross sectional views in the manufacturing steps of the semiconductor light-emitting apparatus according to the embodiment of the present invention.
Figure 7B:
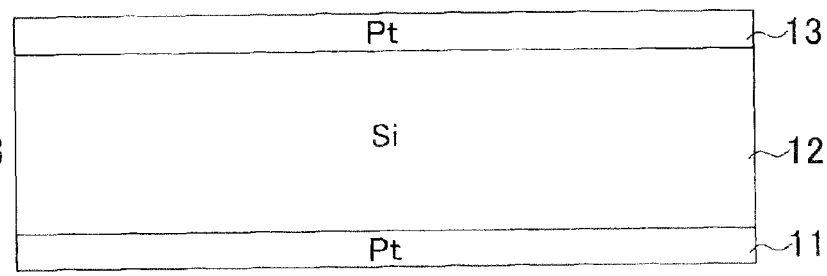

Subsequently, the supporting substrate 12 made of silicon to which boron has been doped at concentration of $3 \times 10^{-18}$ $cm^{-3}$ or more (specific resistance: 0.02 cm or less) is prepared (FIG. 7A). Subsequently, the first Pt layer 11 and the second Pt layer 13 are formed on both surfaces of the supporting substrate 12 by the sputtering (FIG. 7B). The first Pt layer 11 and the second Pt layer 13 may be formed by the evaporation deposition method such as resistance heat evaporation deposition or electron beam evaporation deposition.

Figure 7C:
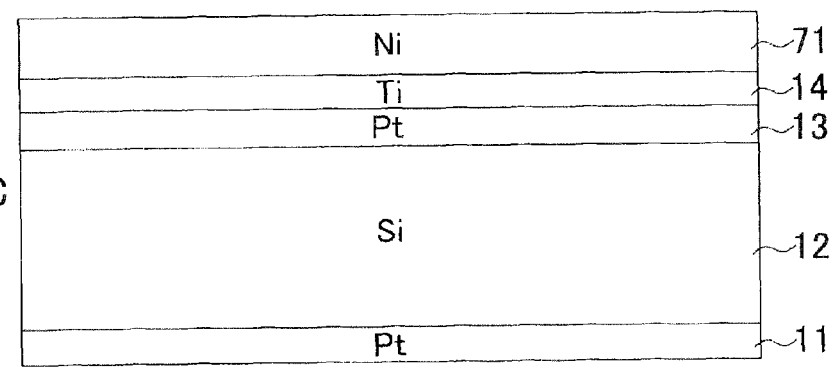

Subsequently, the Ti layer 14 is formed on the second Pt layer 13 by the sputtering method. Further, a second Sn absorbing layer 71 made of Ni is formed on the Ti layer 14 by the sputtering (FIG. 7C). The Ti layer 14 and the second Sn absorbing layer 71 may be formed by the electron beam evaporation deposition. It is desirable that the second Sn absorbing layer 71 has high solder-wettability to the AuSn soldering layer from a viewpoint of suppressing the ball-up when performing melting of the AuSn soldering layer, which will be described hereinafter. Although the second Sn absorbing layer 71 is a layer made of Ni in the embodiment from the viewpoints as mentioned above, it may be a layer made of Pt or Pd (palladium) besides the Ni layer. It is desirable that a film thickness of the second Sn absorbing layer 71 made of Ni is equal to about 100 nm or more from a viewpoint of improving solder-wettability to the AuSn soldering layer and suppressing the ball-up. Further, it is desirable to adjust the film thickness of each of the first Sn absorbing layer 61 and the second Sn absorbing layer 71 so that a total film thickness of the first Sn absorbing layer 61 and the second Sn absorbing layer 71 (that is, the total film thickness of Ni) is equal to 0.4 or more times as large as the film thickness of the AuSn soldering layer, from a viewpoint of adjusting a solidifying rate of the molten solder (AuSn soldering layer, which will be described hereinafter) so that the voids do not remain at the whole bonding interface and in order to make it difficult that the AuSn soldering layer, which will be described hereinafter, is melted again.

Figure 7D:
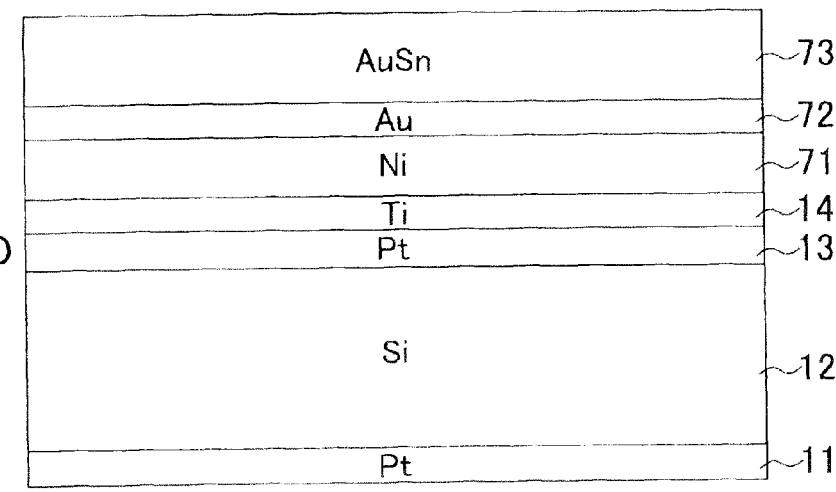

Subsequently, a second Au layer 72 serving as a solder-wettability improving layer is formed on the second Sn absorbing layer 71 by sputtering. Further, an AuSn soldering layer 73 is formed on the second Au layer 72 by sputtering (FIG. 7D). The second Au layer 72 is formed to improve solder-wettability to the AuSn soldering layer 73. In the embodiment in which the second Sn absorbing layer 71 is the layer made of Ni, the second Au layer 72 prevents oxidation of the Ni layer (that is, the second Sn absorbing layer 71). The thickness of the second Au layer 72 is equal to, for example, about 30 nm. A composition ratio of Au and Sn in the AuSn soldering layer 73 is equal to about 8:2 as a weight ratio and to about 7:3 as a ratio of the number of atoms. The thickness of the AuSn soldering layer 73 is equal to, for example, about 600 nm. A layer obtained by adding an additive to the AuSn soldering layer 73 may be formed as a soldering layer. By finishing the above-described steps, the formation of a supporting structural body 70 is completed. The second Sn absorbing layer 71, the second Au layer 72, and the AuSn soldering layer 73 are collectively referred to as a second bonding metal layer.

Figure 8:
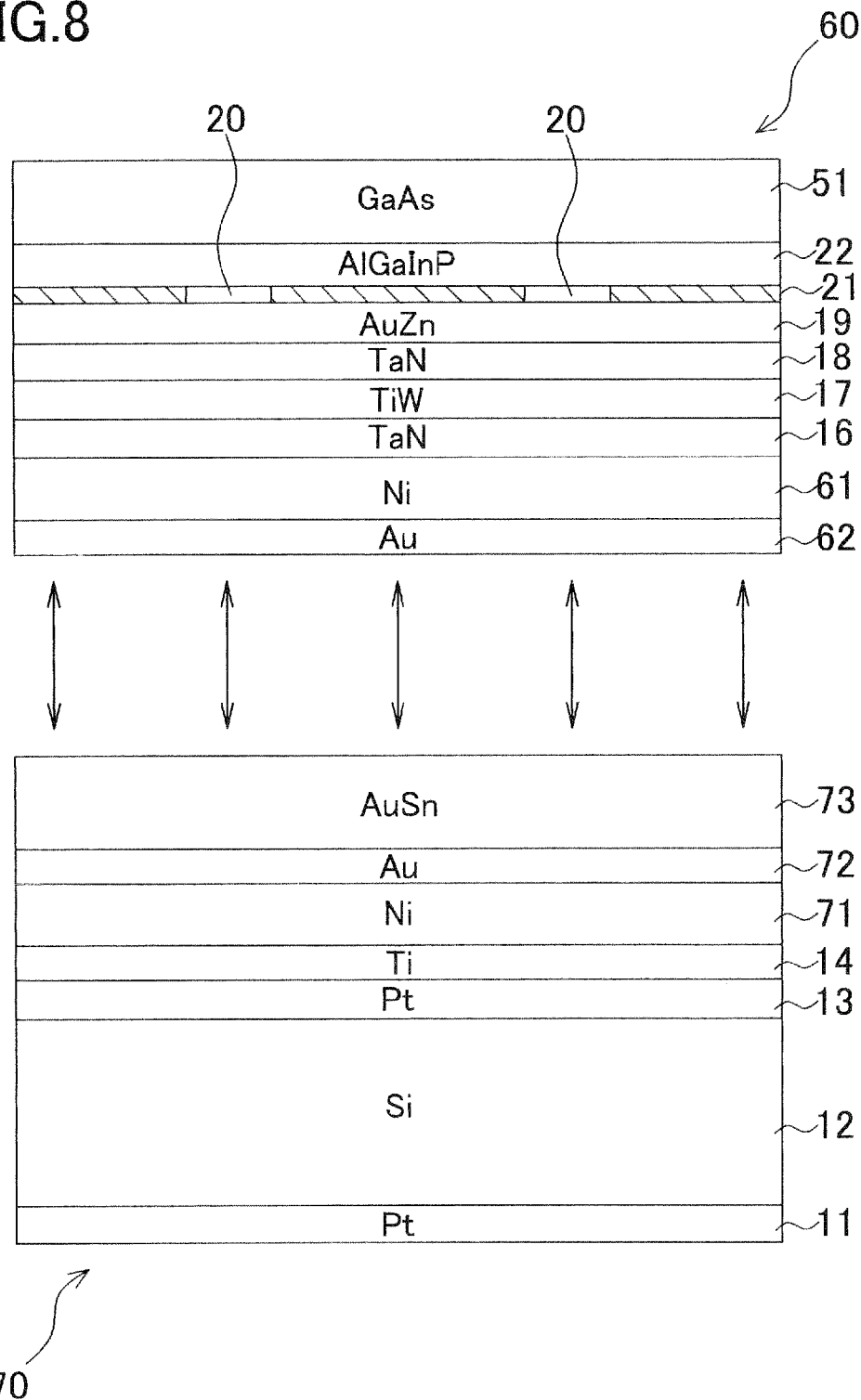
FIG. 8 is a cross sectional view in the manufacturing steps of the semiconductor light-emitting apparatus according to the embodiment of the present invention.
Figure 9:
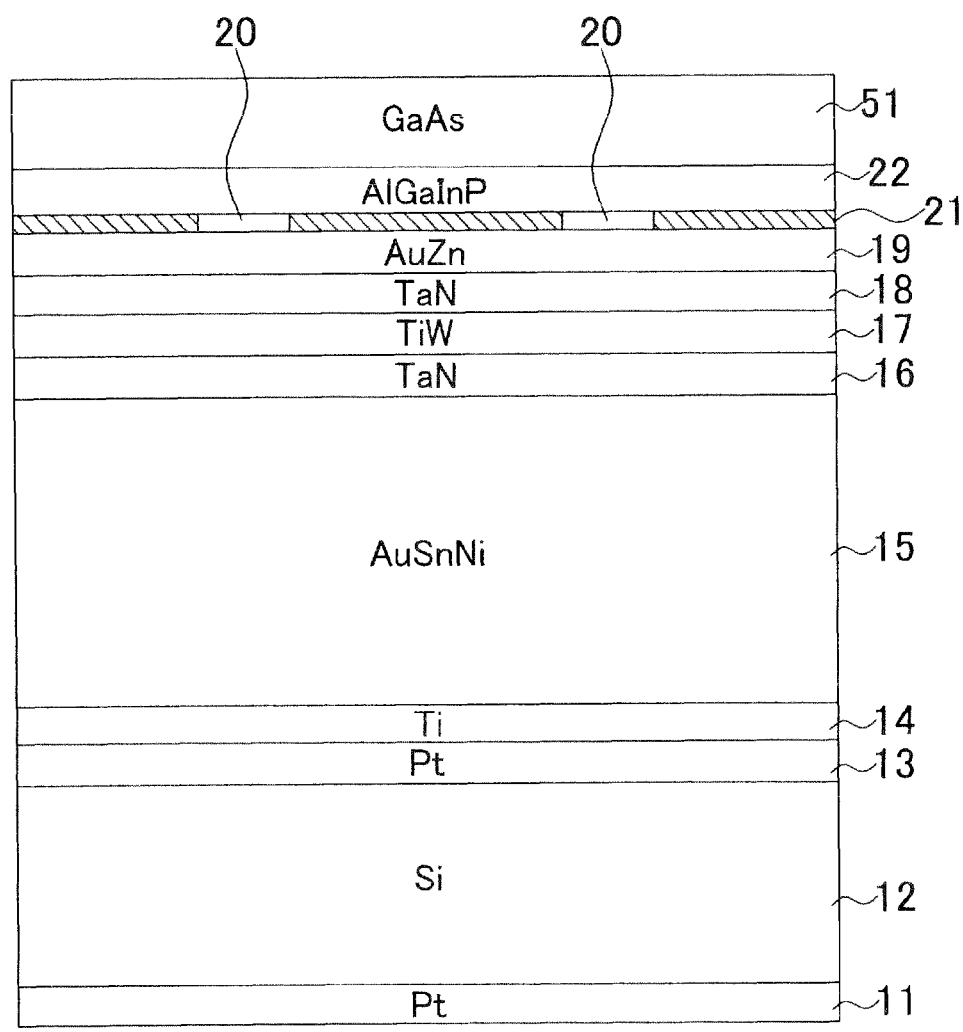
FIG. 9 is a cross sectional view in the manufacturing steps of the semiconductor light-emitting apparatus according to the embodiment of the present invention.

Subsequently, the first Au layer 62 of the semiconductor light-emission structural body 60 and the AuSn soldering layer 73 of the supporting structural body 70 are adhered in opposition to each other. After that, the adhered semiconductor light-emission structural body 60 and the supporting structural body 70 are thermally pressure-bonded under the nitrogen atmosphere (FIG. 8). Conditions of the thermal pressure bonding are set as follows. For example, a pressure is set to about 1 MPa (megapascal), a temperature lies within a range from 320 to 370° C., and a pressure bonding time is set to about 10 minutes. By the thermal pressure bonding, the AuSn soldering layer 73 is melted. Further, Au in the first Au layer 62 and the second Au layer 72 and Ni in the first Sn absorbing layer 61 and the second Sn absorbing layer 71 are fused into the molten AuSn soldering layer 73. Further, Au and Sn in the first Au layer 62, the second Au layer 72, and the AuSn soldering layer 73 are diffused and absorbed into the first Sn absorbing layer 61 and the second Sn absorbing layer 71. Moreover, the molten AuSn soldering layer 73 is solidified, so that the bonding layer 15 made of AuSnNi is formed (FIG. 9).

In the steps mentioned above, the first Sn absorbing layer 61 and the second Sn absorbing layer 71 absorb Sn from the AuSn soldering layer 73 in a state where it has been molten by heating. The first Sn absorbing layer 61 and the second Sn absorbing layer 71 have such a nature that a composition ratio of Sn in the AuSn soldering layer 73 after the solidification is set to be smaller than a composition ratio of Sn in the AuSn soldering layer 73 before the melting. Since a melting point of the AuSn soldering layer 73 rises, consequently, the AuSn soldering layer 73 becomes difficult to be melted again. The melting point of the AuSn solder (composition ratio of the number of atoms: Au:Sn=7:3) which is used for the AuSn soldering layer 73 is equal to about 280° C. Even if the composition ratio of Au and Sn is shifted to either the increasing direction or the decreasing direction, the melting point rises. Particularly, if the composition ratio of Au is shifted to the increasing direction, a rising tendency of the melting point becomes steep. If the first Au layer 62 and the second Au layer 72 are relatively thicker than the AuSn soldering layer 73, when the AuSn soldering layer 73 is melted, the Au atoms in the first Au layer 62 and the second Au layer 72 are fused into the molten AuSn soldering layer 73, and the composition ratio of Au in the fused portion increases. A solidifying rate of the AuSn soldering layer 73, therefore, rises and the AuSn soldering layer 73 will have been solidified before air bubbles generated at the bonding interface are blown out of the bonding interface. It is considered that the voids are consequently generated. If the first Au layer 62 and the second Au layer 72 are thin, the increase in composition ratio of Au that is caused since the first Au layer 62 and the second Au layer 72 are fused into the molten AuSn soldering layer 73 is not dominant, but the increase in composition ratio of Au that is caused since Sn is absorbed into the first Sn absorbing layer 61 and the second Sn absorbing layer 71 becomes dominant. Since a rate at which Sn is absorbed into the first Sn absorbing layer 61 and the second Sn absorbing layer 71 is gentle, the increase in composition ratio of Au in the molten AuSn soldering layer 73 is also gentle. Thus, a time that is necessary until the AuSn soldering layer 73 is solidified becomes long. It is considered that the air bubbles generated at the bonding interface are moved to the edge portion of the bonding interface and a time that is necessary until the air bubbles are blown out to the outside is assured, so that the generation of the voids is prevented. By setting the total thickness of the first Au layer 62 and the second Au layer 72 to 0.39 or less time as large as the film thickness of the AuSn soldering layer 73, the remaining of the air bubbles is suppressed and the sufficient adhesion property can be assured.

Figure 10:
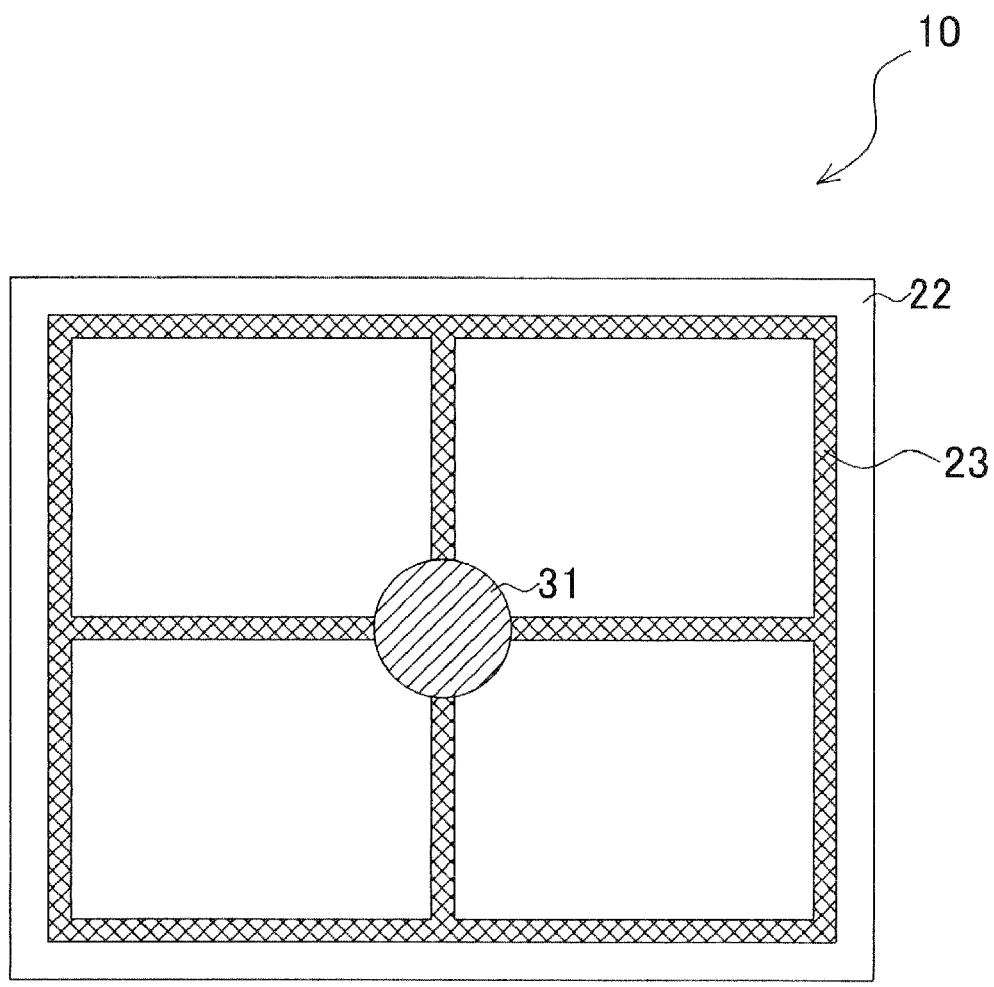
FIG. 10 is a plan view in the manufacturing steps of the semiconductor light-emitting apparatus according to the embodiment of the present invention.
Figure 11:
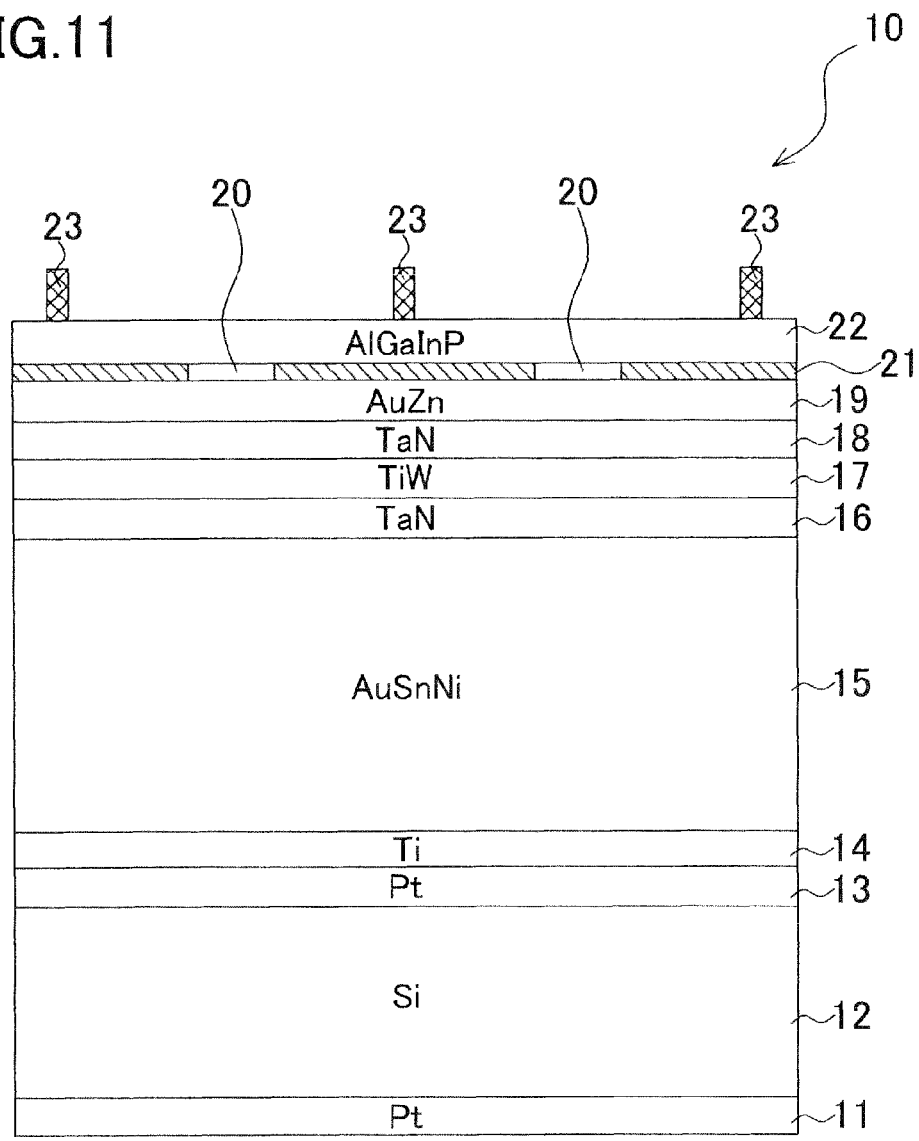
FIG. 11 is a cross sectional view in the manufacturing steps of the semiconductor light-emitting apparatus according to the embodiment of the present invention.

Subsequently, the GaAs substrate 51 is removed by wet etching using a mixture liquid of aqueous ammonia and aqueous hydrogen peroxide. By removing the GaAs substrate 51, the surface of the light-emission operating layer 22 is exposed. The GaAs substrate 51 may be removed by dry etching, CMP (Chemical Mechanical Polishing), mechanical grinding, or the like. Subsequently, the line electrode 23 and the bonding pad 31 which make ohmic-contact with the light-emission operating layer 22 are formed on the light-emission operating layer 22. If n-type AlGaInP is exposed on the surface of the light-emission operating layer 22 with which the line electrode 23 and the bonding pad 31 are come into contact, AuSnNi, AuGeNi, AuSn, or AuGe can be used for the line electrode 23 and the bonding pad 31. The line electrode 23 and the bonding pad 31 are formed into desired shape by a film forming method according to the resistance heat evaporation deposition method, the electron beam evaporation deposition method, sputtering, or the like and by a lift-off method. The desired shapes are, for example, the shape of the lattice-shaped line electrode 23 and the shape of the circular bonding pad 31 locating in the center portion of the line electrode as illustrated in FIG. 10. After that, a heat treatment is performed to the line electrode 23 and the bonding pad 31 at about 400° C. under the nitrogen atmosphere. By the heat treatment, an alloy of the light-emission operating layer 22, the line electrode 23, and the bonding pad 31 is formed and the good ohmic contact is obtained. By finishing the above steps, manufacturing of the semiconductor light-emitting apparatus 10 is completed (FIG. 11).

Figure 12:
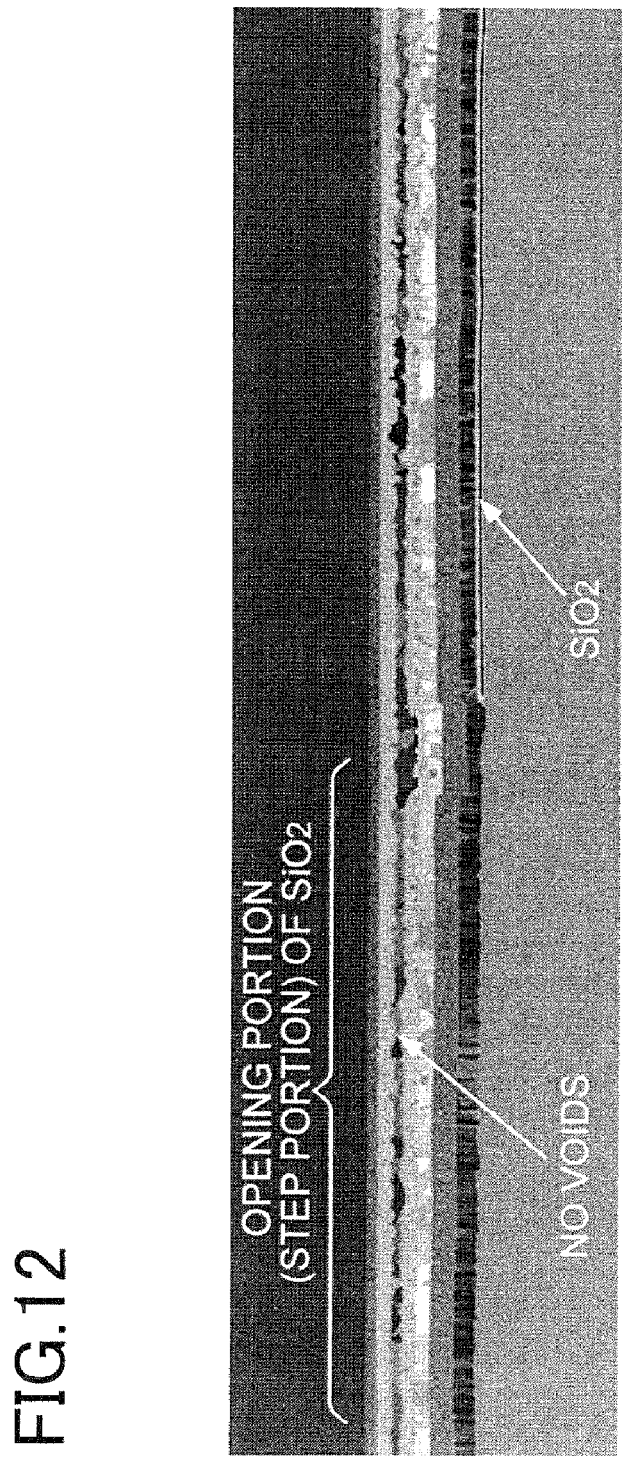
FIG. 12 is a cross sectional photograph of portions near a bonding interface of the semiconductor light-emitting apparatus obtained by a manufacturing method according to the embodiment of the present invention.

FIG. 12 shows a cross sectional photograph of portions near the bonding interface of the semiconductor light-emitting apparatus 10 obtained by the manufacturing method mentioned above. As shown in FIG. 12, it will be understood that the semiconductor light-emitting apparatus 10 having the good bonding interface in which no voids exist in the region corresponding to the opening portion is obtained. A very small number of voids existing in a boundary region of the reflection insulating layer 21 and the opening portion are voids generated by the gaps caused in a lower portion of the resist when the reflection insulating layer 21 has been overetched. The very small number of voids existing in the narrow region do not cause a problem of deterioration in bonding strength and performance of the semiconductor light-emitting apparatus. The voids can be eliminated by precisely controlling the etching time.

Figure 13:
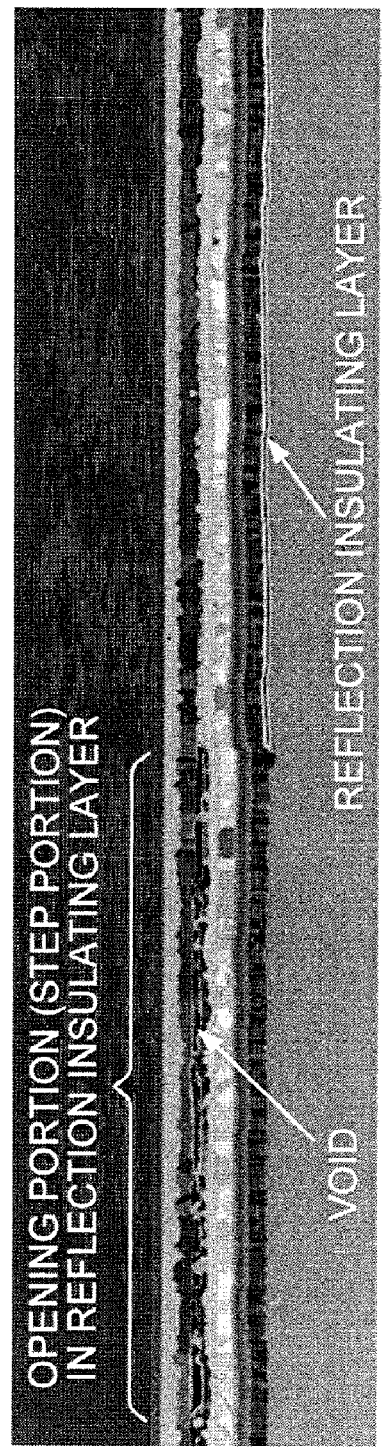
FIG. 13 is a cross sectional photograph of portions near a bonding interface of the semiconductor light-emitting apparatus obtained by a manufacturing method in the related art.

In comparison with FIG. 12, FIG. 13 as a Comparative Example-1 shows a cross sectional photograph of portions near a bonding interface of the semiconductor light-emitting apparatus manufactured by a manufacturing method in which the step of forming the contact portions having the thickness adapted to flatten the opening portions of the reflection insulating layer is omitted. As shown in FIG. 13, it will be understood that in the semiconductor light-emitting apparatus shown in FIG. 13, the voids remain in the region corresponding to the opening portion at the bonding interface.

When comparing areas of the voids in the cross sectional photographs of FIGS. 12 and 13, the area of the voids in the semiconductor light-emitting apparatus 10 of the present invention is equal to $\frac{1}{18}$ of the area of the voids in the semiconductor light-emitting apparatus of Comparative Example-1.

In a semiconductor light-emitting apparatus of Comparative Example-2 formed by a manufacturing method in which the step of forming the contact portions having the thickness adapted to flatten the opening portions of the reflection insulating layer and the step of forming the Sn absorbing layer (solder absorbing layer) are omitted, voids remained at the whole bonding interface and many voids remain in the region corresponding to the opening portion.

Although the AuSn soldering layer 73 has been formed only on the supporting structural body 70 side in the manufacturing method mentioned above, the AuSn soldering layer 73 may be formed in the semiconductor light-emission structural body 60, that is, only on the first Au layer 62 or may be formed in both portions of the semiconductor light-emission structural body 60 and the supporting structural body 70. The semiconductor light-emission structural body 60 and the supporting structural body 70 may have such a structure that the first Au layer 62 and the second Au layer 72 are not included.

As mentioned above, according to the manufacturing method of the semiconductor light-emitting apparatus and the semiconductor light-emitting apparatus 10 of the invention, the generation of the voids at the bonding interface of the light-emission operating layer 22 and the supporting substrate 12 is suppressed, since the contact portion 20 which has the thickness adapted to flatten the opening portions 53 and has been embedded therein is formed in each of the plurality of opening portions 53 of the reflection insulating layer 21 formed on the light-emission operating layer 22. According to the present invention, reduction in light-emission efficiency, lifetime, and bonding strength of the semiconductor light-emitting apparatus can be prevented.

The present invention has been described above with reference to the preferred embodiments. It should be understood that many modifications and variations could easily have been made by the person with ordinary skill in the art and all of those modifications and variations are incorporated in the scope of claims of the invention.

This application is based on the Japanese Patent Application No. 2008-213800, the entire content of which is incorporated by reference herein.

What is claimed is:

1. A method of manufacturing a semiconductor light-emitting apparatus, the method comprising:
    forming a light-emission operating layer on a growth substrate;
    forming a reflection insulating layer on said light-emission operating layer;
    forming a plurality of opening portions into said reflection insulating layer;
    forming contact portions such that said contact portions are embedded in each of said plurality of opening portions and have a same thickness as said reflection insulating layer, wherein said contact portions flatten said opening portions and form a flattened surface with said reflection insulating film;
    forming an electrode layer on said flattened surface of said reflection insulating layer and said contact portions;
    forming a first bonding metal layer on said electrode layer;
    preparing a supporting substrate in which a second bonding metal layer has been formed on a surface; and
    performing bonding by melting and joining said first bonding metal layer and said second bonding metal layer.

2. A method according to claim 1, wherein each of said first bonding metal layer and said second bonding metal layer has a solder absorbing layer, and at least one of said first bonding metal layer and said second bonding metal layer has a soldering layer provided on said solder absorbing layer.

3. A method according to claim 1, further comprising:
    removing said growth substrate after said bonding; and
    forming an external connecting electrode so as to surround regions which are located on an exposed surface of said light-emission operating layer exposed by the removal of said growth substrate and which correspond to said contact portions.

4. A method according to claim 3, wherein said external connecting electrode comprises:
    a bonding pad provided at a center portion on the exposed surface; and
    a lattice-shaped line electrode which surrounds said bonding pad and is connected to said bonding pad.

5. A method according to claim 1, wherein:
    said plurality of opening portions in said reflection insulating layer are formed by photolithography using a resist, and
    said contact portions are formed while said resist used in said photolithography remains.

* * * * *